(12) United States Patent
Lee et al.

(10) Patent No.: US 11,513,624 B2
(45) Date of Patent: Nov. 29, 2022

(54) TOUCH DISPLAY DEVICE AND METHOD OF MANUFACTURING OF THE SAME

(71) Applicant: LG DISPLAY CO., LTD., Seoul (KR)

(72) Inventors: Mi-Rae Lee, Paju-si (KR);
Kyoung-Mook Lee, Paju-si (KR);
Nack-Bong Choi, Paju-si (KR);
Young-Jun Jeon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/082,605

(22) Filed: Oct. 28, 2020

(65) Prior Publication Data

US 2021/0149513 A1   May 20, 2021

(30) Foreign Application Priority Data

Nov. 15, 2019   (KR) .................. 10-2019-0146437

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0445* (2019.05); *H01L 27/323* (2013.01);
(Continued)

(58) Field of Classification Search
None
See application file for complete search history.

(56) References Cited

U.S. PATENT DOCUMENTS

| 2012/0044191 A1* | 2/2012 | Shin | G06F 3/0446 |
| | | | 430/312 |
| 2014/0062909 A1* | 3/2014 | Choi | G06F 3/041 |
| | | | 345/173 |

(Continued)

FOREIGN PATENT DOCUMENTS

| JP | 2014-21675 A | 2/2014 |
| JP | 2017-117086 A | 6/2017 |

(Continued)

OTHER PUBLICATIONS

Office Action issued in corresponding Japanese Patent Application No. 2020-176497, dated Oct. 5, 2021.

(Continued)

*Primary Examiner* — Christopher R Lamb
(74) *Attorney, Agent, or Firm* — Morgan, Lewis & Bockius LLP

(57) ABSTRACT

The present disclosure provides a touch display device including: a plurality of emitting elements; an adhesive layer over the emitting elements; a first touch electrode and a second touch electrode over the adhesive layer and in an active area; a pad electrode over the adhesive layer and in a touch pad region; and a protection layer over the first touch electrode, the second touch electrode and the pad electrode, wherein the first and second touch electrode are insulated by an insulating layer, and the protection layer includes at least one contact hole corresponding to the pad electrode, and wherein the pad electrode includes a plurality of electrode layers, and one of the plurality of electrode layers extends from the first touch electrode or the second touch electrode.

20 Claims, 8 Drawing Sheets

(51) Int. Cl.
   *H01L 27/32*    (2006.01)
   *H01L 51/52*    (2006.01)
   *H01L 51/56*    (2006.01)

(52) U.S. Cl.
   CPC .......... *H01L 51/5237* (2013.01); *H01L 51/56* (2013.01); *G06F 2203/04103* (2013.01)

(56) References Cited

U.S. PATENT DOCUMENTS

| | | |
|---|---|---|
| 2015/0185942 A1 | 7/2015 | Hyoung-su et al. |
| 2017/0123543 A1* | 5/2017 | Choi ..................... H01L 27/323 |
| 2018/0211082 A1 | 7/2018 | Seok et al. |
| 2018/0275801 A1* | 9/2018 | Nakayama .............. G06F 3/047 |
| 2018/0329552 A1 | 11/2018 | Chang-Hyun et al. |
| 2019/0035860 A1 | 1/2019 | Jae-Young et al. |
| 2019/0129535 A1 | 5/2019 | Choi et al. |

FOREIGN PATENT DOCUMENTS

| | | |
|---|---|---|
| JP | 2019-83010 A | 5/2019 |
| KR | 10-2018-0044640 A | 5/2018 |

OTHER PUBLICATIONS

Office Action issued in corresponding Taiwan Patent Application No. 109134624, dated Jun. 7, 2021.
Extended European Search Report dated Mar. 18, 2021, issued in corresponding European Patent Application No. 20200245.7.

* cited by examiner

TOUCH DISPLAY DEVICE AND METHOD OF MANUFACTURING OF THE SAME

CROSS-REFERENCE TO RELATED APPLICATIONS

This application claims priority to and the benefit of Republic of Korea Patent Application No. 10-2019-00146437 filed in the Republic of Korea on Nov. 15, 2019, which is hereby incorporated by reference.

BACKGROUND

Technical Field

The present disclosure relates to a touch display device, and more particularly, to a touch display device being capable of minimizing a defect and a manufacturing method of the touch display device.

Description of the Related Art

A touch sensor is installed in a flat panel display device, e.g., a liquid crystal display (LCD) device, a field emission display (FED) device, a plasma display panel (PDP), an electroluminescent display device or an electrophoretic display device, and is an input device to input predetermined information by user's press or touch while viewing the display device.

The touch senor for the display devices may be classified into an add-on type touch screen panel (touch sensor), an on-cell type touch screen panel and an integrated type (or an in-cell type) touch screen panel. In the add-on type touch screen panel, after a display panel and a touch screen panel are independently manufactured, the touch screen panel is attached on an upper substrate of the display panel. In the on-cell type touch screen panel, elements (or members) for the touch sensor are formed on a surface of an upper substrate of a display panel. In the integrated type touch sensor, the touch sensor is included inside a display panel.

Recently, a flexible or foldable touch display device is developed. Particularly, the touch sensor or the touch screen panel is widely applied to an organic light emitting display (OLED) device as the flexible or foldable display device.

As a touch sensor used for a flexible, bendable, or foldable touch display device, various types of touch sensors, i.e., the add-on type, the on-cell type or the integrated type, can be used. However, since the add-on type touch display device, which is manufactured by attaching the touch panel on the display panel, has relatively thick, it is difficult to realize a flexible or foldable display device.

On the other hand, the integrated type touch sensor is most frequently used to the flexible or foldable OLED device. However, since an encapsulation layer (or encapsulating film), which includes an organic material and/or an inorganic material, is required in the OLED device to minimize moisture or oxygen penetration, a manufacturing method of the integrated touch OLED device is complicated. In addition, the integrated touch OLED device may be easily damaged by the bending stress which may be occurred in a folding operation.

In the on-cell type touch OLED device, the touch sensor may be disposed or bonded on the encapsulation layer. In addition, the on-cell type touch sensor can be applied to display devices other than the OLED device.

In a bonding method of the on-cell type touch display device, the touch sensor is electrically connected to a pad region for transmitting and receiving data. The pad region is disposed on the outside, not on the inside, where the touch sensor and the display substrate are bonded. However, defects may occur due to the above-mentioned structure.

Specifically, in order to manufacture a touch sensor by the bonding method, after the touch sensor is formed using a temporary manufacturing substrate, a step of bonding the touch sensor on the temporary manufacturing substrate with the display panel is performed.

After the touch sensor disposed on the temporary manufacturing substrate is attached to the display panel, the temporary manufacturing substrate is removed (separated). However, in the manufacturing method of the touch display device, the pad region for transmitting and receiving data of the touch sensor may not be smoothly separated from the temporary manufacturing substrate such that defects may be generated.

SUMMARY

Accordingly, embodiments of the present disclosure are directed to a touch display device and a manufacturing method of the same that substantially obviate one or more of the problems due to limitations and disadvantages of the related art, and have other advantages.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages in accordance with the purpose of the embodiments of the present disclosure, as described herein, an aspect of the present disclosure is a touch display device comprising: a plurality of emitting elements; an adhesive layer over the emitting elements; a first touch electrode and a second touch electrode over the adhesive layer and in an active area; a pad electrode over the adhesive layer and in a touch pad region; and a protection layer over the first touch electrode, the second touch electrode and the pad electrode, wherein the first and second touch electrode are insulated by an insulating layer, and the protection layer includes at least one contact hole corresponding to the pad electrode, and wherein the pad electrode includes a plurality of electrode layers, and one of the plurality of electrode layers extends from the first touch electrode or the second touch electrode.

Another aspect of the present disclosure is a method of manufacturing a touch display device comprising: forming a sacrificial layer on a temporary substrate; forming a protection layer including a contact hole in a touch pad region on the sacrificial layer; forming a first pad electrode in the touch pad region; forming a first touch electrode on the protection layer and a second pad electrode on the first pad electrode; attaching the temporary substrate and a display substrate; and removing the temporary substrate and the sacrificial layer.

It is to be understood that both the foregoing general description and the following detailed description are examples and are explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate aspect of the disclosure and together with the description serve to explain principles of the disclosure.

DETAILED DESCRIPTION

Figure 1:
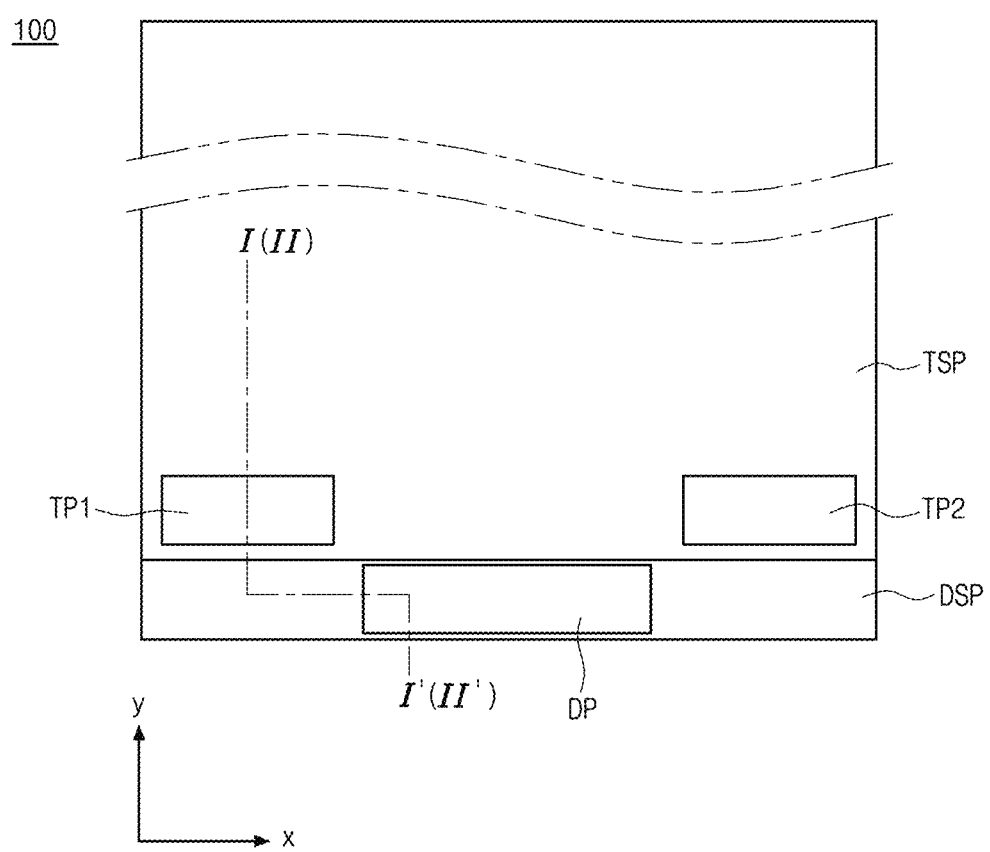
FIG. 1 is a schematic plane view of a touch display device according to an embodiment of the present disclosure.

As mentioned above, the pad region may be damaged in the on-cell type touch display device. The inventors of the present disclosure have invented a touch display device (or a touch display apparatus) and a manufacturing method of the same being capable of minimizing defects that may occur in the process of manufacturing the touch display device including an on-cell type touch sensor.

The present disclosure may provide a touch display device being capable of minimizing defects occurred in a manufacturing process for a pad region for transmitting and receiving touch-related data.

The present disclosure may provide a touch display device being capable of minimizing defect yield in a manufacturing process for a pad region for transmitting and receiving touch signal.

The present disclosure is not limited to the above-mentioned objects, and other objects will be clearly understood by those skilled in the art from the following description.

Advantages and technical features of the present disclosure, and methods for achieving the advantages and the technical features will be clarified with reference to embodiments described below in detail together with the accompanying drawings. However, the present disclosure is not limited to the embodiments disclosed below, but will be implemented in various different forms. The embodiments allow the disclosure of the present disclosure to be complete and the ordinary skilled in the art to fully understand. The present disclosure is only defined by the scope of the claims.

The shapes, sizes, ratios, angles, numbers, etc., disclosed in the drawings for describing the embodiments of the present invention are exemplary, and the present invention is not limited to the drawings. The same reference numerals refer to the same components throughout the specification. In addition, in the description of the present disclosure, when it is determined that detailed descriptions of related known technologies may unnecessarily obscure the subject matter of the present disclosure, detailed descriptions thereof will be omitted. When 'include', 'have', 'consist of', etc., are used in this specification, other parts may be added unless 'only' is used. When a component is expressed as a singular number, the plural number is included unless otherwise specified.

In interpreting the components, it is interpreted as including the error range even if there is no explicit description.

In the case of the description of the positional relationship, for example, when the positional relationship of two parts is described as 'on', 'over', 'under', 'at a side', etc., one or more other parts may be positioned between the two parts unless 'right' or 'direct' is used.

Terms 'first', 'second', etc., are used to describe various components, but these components are not limited by these terms. These terms are only used to distinguish one component from another component. Accordingly, the first component mentioned below may be the second component within the technical spirit of the present disclosure.

Each of features of the various embodiments of the present disclosure may be partially or wholly combined or mixed with each other, and technically various interlocking and driving is possible. Each of the embodiments may be independently implemented with respect to each other or may be implemented together in an association relationship.

Reference will now be made in detail to aspect of the disclosure, examples of which are illustrated in the accompanying drawings.

Figure 2A:
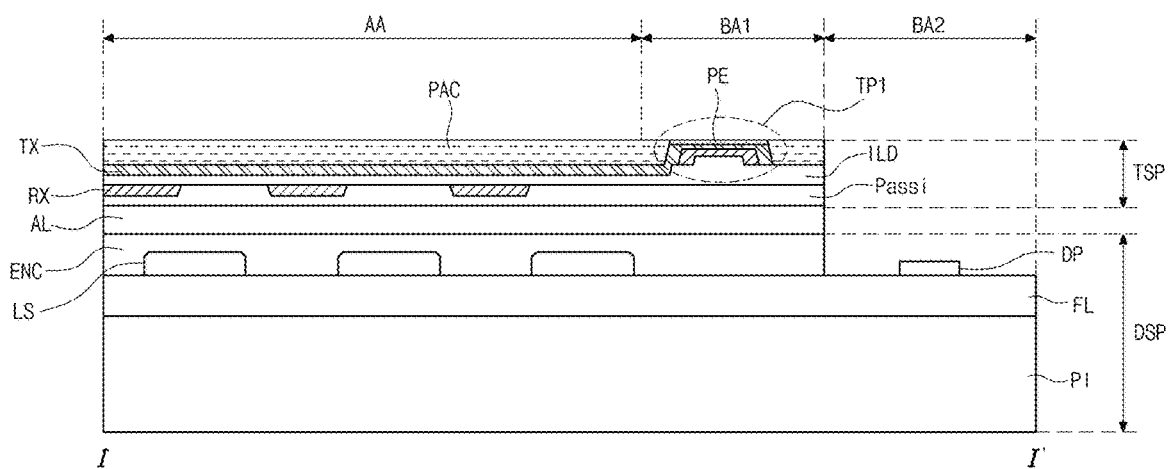
FIGS. 2A and 2B are schematic cross-sectional views taken along the lines I-I' and II-II' of FIG. 1, respectively.
Figure 2B:
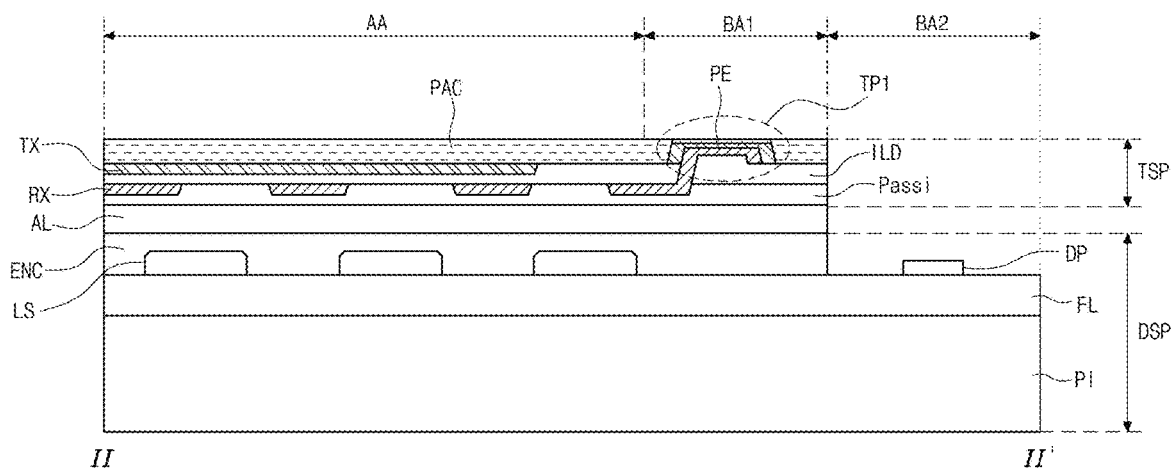

FIG. 1 is a schematic cross-sectional view of a touch display device according to an embodiment of the present disclosure, and FIGS. 2A and 2B are schematic cross-sectional views taken along the lines I-I' and II-II' of FIG. 1, respectively.

Referring to FIGS. 1, 2A and 2B, a touch display device 100 includes a display substrate DSP and a touch substrate TSP. The display substrate DSP may be an organic light emitting display substrate, but it is not limited thereto.

The display substrate DSP may include a substrate PI, which includes an active area AA and first and second bezel areas BA1 and BA2, a light emitting element LS, which includes an anode, an organic emitting layer and a cathode, over the substrate PI and a thin film transistor (TFT) on the substrate PI for controlling the light emitting element LS according to a driving signal.

The display substrate DSP and the touch substrate TSP may have a structure that is bonded by an adhesive layer AL, and the adhesive layer AL may be an epoxy-based adhesive layer. The adhesive layer AL may have a structure that is directly adjacent or directly contacts an encapsulation layer ENC of the display substrate DSP and a second insulating layer Passi of the touch substrate TSP.

The organic emitting layer in the light emitting element LS is liable to be penetrated by oxygen and moisture. Accordingly, the organic emitting layer may be covered by the encapsulation layer ENC to minimize the penetration of oxygen and moisture into the light emitting element LS.

The encapsulation layer ENC may further include an absorbent or a nano-material for improving the light efficiency of light emitted from the light emitting element LS. In addition, the encapsulation layer ENC may include a plurality of layers, in which an organic material layer and an inorganic material layer are alternately stacked, and may further include various configurations for preventing cracks in order to provide a flexible display device. The explanation to this configuration is omitted.

The light emitting element LS including the anode, the organic emitting layer, and the cathode is controlled by a circuit unit including the TFT. Electrical signals and current for such control may be supplied through a circuit board connected to a data pad DP.

The light emitting element LS controls the amount of light and various wavelengths of light of the plurality of light emitting elements LS to display a desired image. The light emitting element LS may further include a color filter layer.

The substrate PI of the display substrate DSP may be a polyimide substrate to be used for a flexible display device or a foldable display device and may have a multi-layered structure.

On the other hand, the display substrate DSP may further include a planarization layer FL for the arrangement of the light emitting elements LS. The planarization layer FL may be made of a material such as photo-acryl and may include a plurality of layers such that the light emitting elements LS, the TFT and the signal lines, e.g., the data lines, which are connected to the TFT, may be disposed on or over the planarization layer FL or between the plurality of layers.

The data lines may be electrically connected to a data pad DP in the second bezel area BA2. In this instance, the data pad DP may be not covered by the touch substrate TSP for connection with the circuit board.

On the other hand, the touch substrate TSP may include at least one touch pad region, e.g. touch pad regions TP1 and TP2, to transmit the electrical signal from the touch sensor to the circuit board. The touch pad regions TP1 and TP2 may be disposed in the first bezel area BA1 of the touch substrate TSP.

The touch substrate TSP has the active area AA and the first bezel area BA1. The touch substrate TSP includes a protection layer PAC, a first insulating layer ILD, the second insulating layer Passi, a first touch electrode TX and a second touch electrode RX.

Although not shown, each of the first touch electrode TX and the second touch electrode RX constituting the touch sensor may be touch electrodes having a metal mesh shape. The first touch electrode TX and the second touch electrode RX are insulated by the first insulating layer ILD.

Each of the first touch electrode TX and the second touch electrode RX may be made of a transparent conductive material, e.g., indium-tin-oxide (ITO), indium-zinc-oxide (IZO), or gallium-doped zinc oxide (GZO), or a metallic material, e.g., titanium (Ti), aluminum (Al), copper (Cu), or molybdenum (Mo). Each of the first touch electrode TX and the second touch electrode RX may have a single-layered structure or a multi-layered structure.

The touch pad regions TP1 and TP2 include at least one pad electrode PE. The pad electrode PE may have a multi-layered structure including at least one metal or conductive material. The protection layer PAC may have an open section for electrical connection with a circuit board.

The protection layer PAC may have functions of photo-resist (PR) and a passivation layer. For example, the protection layer PAC may be formed of an organic material having low dielectric constant.

Referring to FIGS. 2A and 2B, at least one electrode layer of the pad electrode PE may be an electrode formed by extension of the first touch electrode TX or the second touch electrode RX. Namely, one of the first and second touch electrodes TX and RX may extend into one of the touch pad regions TP1 and TP2 and the other one of the first and second touch electrodes TX and RX may extend into the other one of the touch pad regions TP1 and TP2 to form the at least one electrode of the pad electrode PE. As a result, as shown in FIG. 2A, the pad electrode PE in the first touch pad region TP1 is electrically connected to the first touch electrode TX, while the pad electrode PE in the second touch pad region TP2 is electrically connected to the second touch electrode RX. Alternatively, as shown in FIG. 2B, the pad electrode PE in the first touch pad region TP1 is electrically connected to the second touch electrode RX, while the pad electrode PE in the second touch pad region TP2 is electrically connected to the first touch electrode TX.

In FIGS. 2A and 2B, the pad electrode PE in the first touch pad region TP1 extends from one of the first and second touch electrodes TX and RX, and the pad electrode PE in the second touch pad region TP2 extends from the other one of the first and second touch electrodes TX and RX. Alternatively, the pad electrode PE may be connected to one of the first and second touch electrodes TX and RX by a routing line.

A plurality of first touch electrodes TX and a plurality of second touch electrodes RX are disposed on the touch substrate TSP. Since the first touch electrode TX and the second touch electrode RX cross each other with the first insulating layer ILD interposed therebetween, a mutual capacitance is formed therebetween. Accordingly, when the touch substrate TSP is touched, the mutual capacitance between the first touch electrode TX and the second touch electrode RX is changed. The coordinates of the touch position can be detected by measuring the change of the mutual capacitance.

Figure 3:
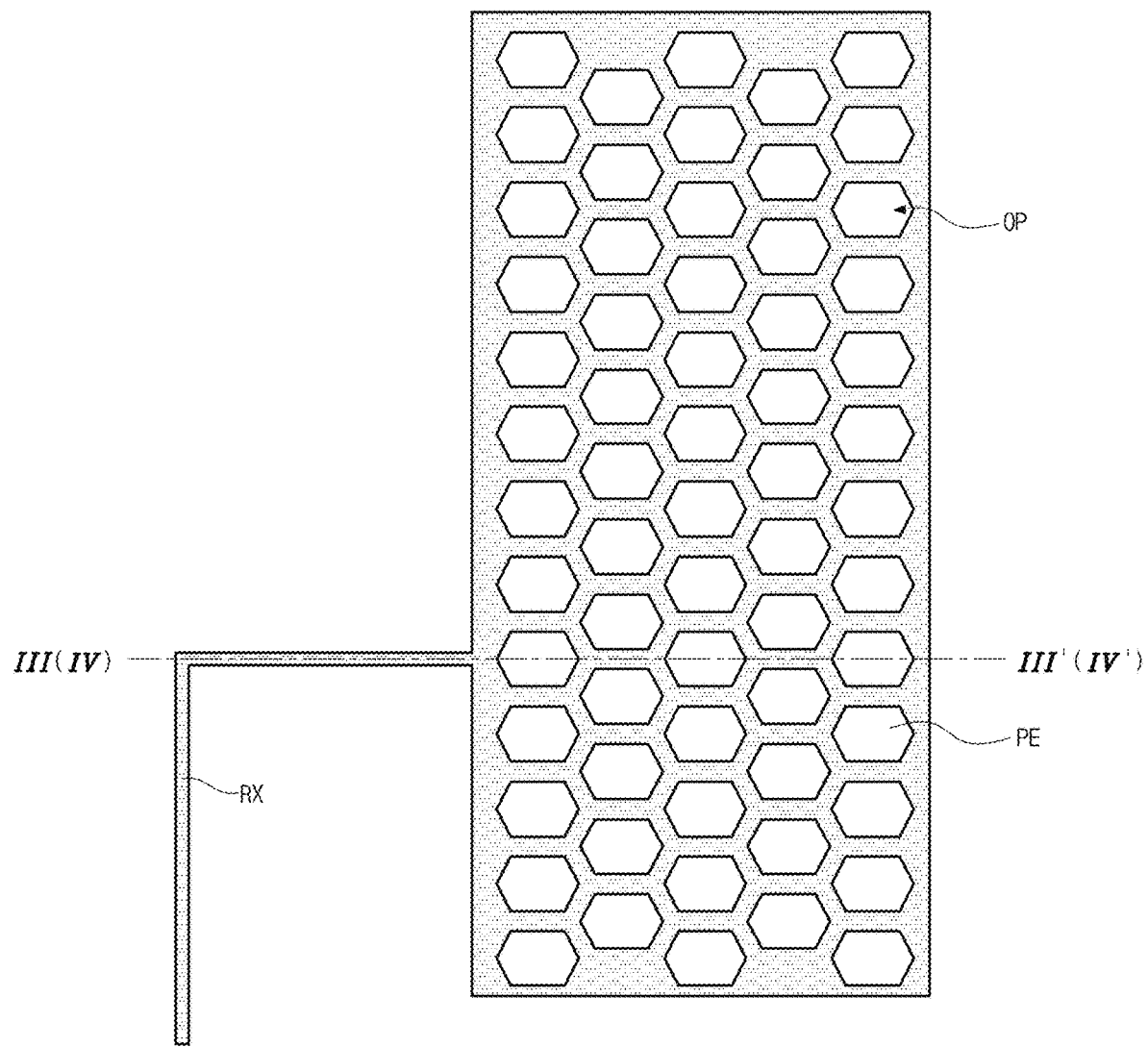
FIG. 3 is a schematic plane view illustrating a touch pad region of a touch display device according to an embodiment of the present disclosure.
Figure 4A:
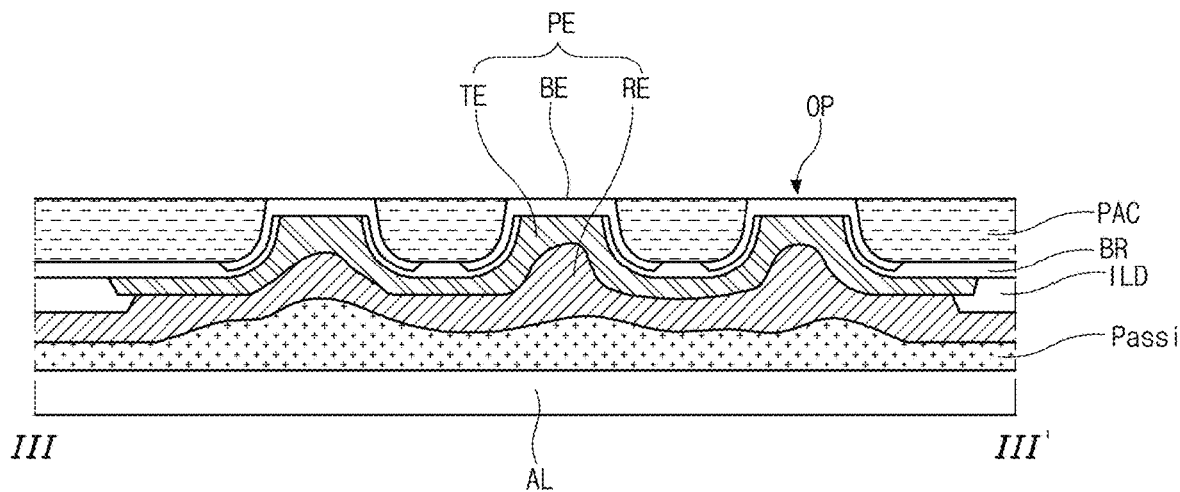
FIGS. 4A and 4B are schematic cross-sectional views taken along the lines and IV-IV' of FIG. 3, respectively.
Figure 4B:
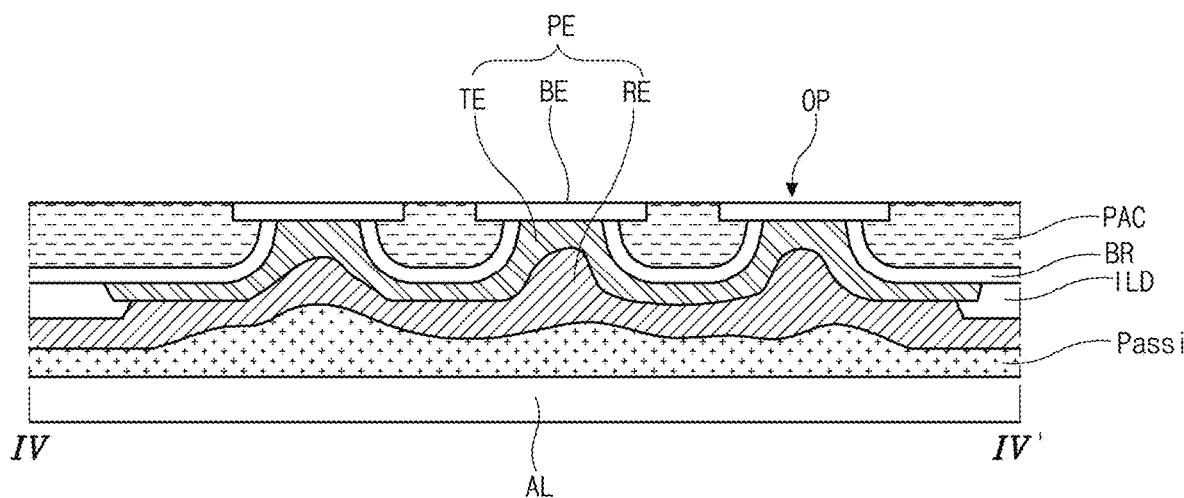

FIG. 3 is a schematic plane view illustrating a touch pad region of a touch display device according to an embodiment of the present disclosure, and FIGS. 4A and 4B are schematic cross-sectional views taken along the lines and IV-IV' of FIG. 3, respectively.

Referring to FIGS. 3 and 4A to 4B, the touch pad region has a plurality of open sections (or openings) OP. The open section OP is a contact hole that exposes a portion of the pad electrode PE, and the exposed pad electrode PE is electrically connected to a flexible substrate or a circuit board by using a connection element such as a conductive ball.

The single pad electrode PE may correspond to the plurality of open sections OP. Namely, the pad electrode PE may correspond to two or more contact holes. The open section (OP) may have a polygonal shape such as a rectangular shape, pentagonal shape or hexagonal shape. As described below, the step of removing the temporary substrate in the manufacturing process of the touch substrate TSP using the temporary substrate is essential. A laser lift-off (LLO) process is performed in the step of removing the temporary substrate.

In the process of removing the temporary substrate with the LLO process, the heat by the laser, which is applied to the pad electrode PE, is more uniformly dissipated in the open section OP of the hexagonal shape than in the open section OP of the rectangular shape. In addition, a thermal stress to an adjacent element by the open section OP of the hexagonal shape is decreased in comparison to the open section OP of the rectangular shape. Accordingly, the open section OP of the hexagonal shape is preferred.

The uniformity of heat transfer and heat dissipation can minimize anomalies in the adhesive strength between the pad electrode PE and the temporary substrate during the LLO process such that defects such as tearing of the pad electrode PE can be minimized or prevented.

Referring to FIGS. 4A and 4B, the pad electrode PE may have a multi-layered structure including at least one electrode layer.

As mentioned above, the pad electrode PE includes an electrode layer extending from the first touch electrode TX or the second touch electrode RX. The pad electrode PE may be electrically connected to the first touch electrode TX or the second touch electrode RX. Alternatively, the pad electrode PE may be electrically connected to the first touch electrode TX or the second touch electrode RX by a separate wiring electrode, i.e., the routing line.

The pad electrode PE includes a first pad electrode BE as a top layer. The first pad electrode BE may be disposed to correspond to the open section OP of the protection layer PAC. The first pad electrode BE may be disposed to fill the inner side surface of the open section OP in the protection layer PAC according to the arrangement order of the first pad electrode BE and the protection layer PAC. Namely, as shown in FIG. 4A, a center of the first pad electrode BE may correspond to the open section OP in the protection layer PAC to be exposed through the open section OP, and edges of the first pad electrode BE may contact the side surface of the protection layer PAC in the open section OP. Alternatively, as shown in FIG. 4B, a center of the first pad electrode BE may correspond to the open section OP in the protection layer PAC to be exposed through the open section OP, and edges of the first pad electrode BE may be covered by the protection layer PAC. The protection layer PAC may be disposed between the first pad electrode BE and a second pad electrode TE.

The pad electrode PE may be an electrode layer including a plurality of electrode layers (sub-layers) as described above. For example, the pad electrode PE may include the first pad electrode BE, the second pad electrode TE, which is formed of the same material and disposed on the same layer as the first touch electrode TX, and a third pad electrode RE, which is formed of the same material and disposed on the same layer as the second touch electrode RX. Namely, the pad electrode PE may have a triple-layered structure. Alternatively, the pad electrode PE may have a double-layered structure including the first pad electrode BE and the second pad electrode TE without the third pad electrode RE or the first pad electrode BE and the third pad electrode RE without the second pad electrode TE. Since the pad electrode PE needs to maintain a certain thickness in the electrical connection using the circuit board and the conductive ball, the required thickness of the pad electrode PE may be provided by forming the pad electrode PE of the same metallic material as the first and second touch electrodes TX and RX in the step of forming the first and second touch electrodes TX and RX. In addition, a wiring electrode for electrical connection between the pad electrode PE and the touch sensor can be formed at the same time.

A barrier layer BR is disposed on the protection layer PAC to improve the uniformity of the touch signal. When the barrier layer BR is disposed, the film releasing (or separating) problem may occur in a peripheral region of the substrate. A plasma treatment may be performed on the barrier layer BR to prevent the above problem.

The open section OP in the protection layer PAC may be a reverse-tapered shape with respect to a surface of the adhesive layer AL or the substrate PI of the display substrate DSP.

The first pad electrode BE is plasma-treated together in the process of plasma treatment to increase the adhesion strength of the protection layer PAC. Namely, any one layer of the first pad electrode BE may be a plasma-treated electrode layer.

FIGS. 5A to 5E are schematic cross-sectional views illustrating a manufacturing method of a touch display device according to an embodiment of the present disclosure.

The explanation of the manufacturing method of the touch display device is focused on a step of forming the pad electrode.

The touch substrate TSP including the touch sensor is formed using a temporary substrate SUB. Since a glass substrate has an advantage in a laser lift-off (LLO) process using a laser, the temporary substrate SUB may be a glass substrate.

Figure 5A:
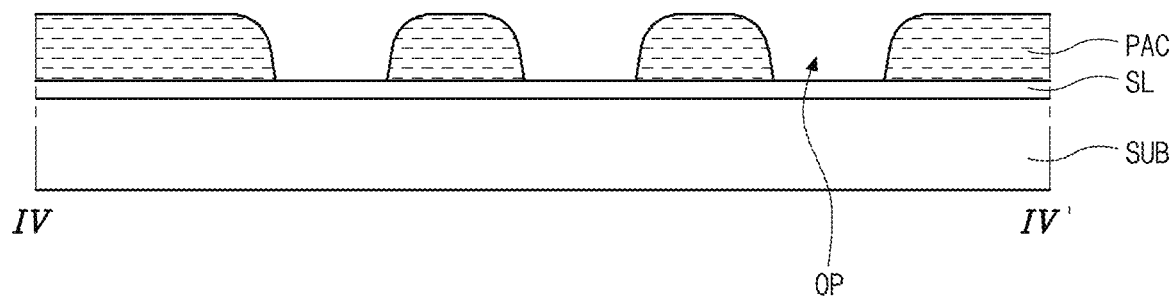
FIGS. 5A to 5E are schematic cross-sectional views illustrating a manufacturing method of a touch display device according to an embodiment of the present disclosure.

In a method of manufacturing a touch display device using the glass substrate as the temporary substrate SUB, a sacrificial layer SL is disposed (formed) on the glass substrate, and then a protection layer PAC is disposed on the sacrificial layer SL, as shown in FIG. 5A.

The sacrificial layer SL may be hydrogenated amorphous silicon (a-Si:H) or hydrogenated and doped amorphous silicon (a-Si:Hn+ or a-Si:H;p+).

The hydrogen of the sacrificial layer SL is combined (connected or bonded) with the silicon of the temporary substrate SUB. When the laser is irradiated, the combination (connection or the bond) between the hydrogen of the sacrificial layer SL and the silicon of the temporary substrate SUB are cut off such that the separation of the temporary substrate SUB becomes easier.

The protection layer PAC is disposed on the sacrificial layer SL. For example, the protection layer PAC may be an organic insulating layer of photo-acryl. A plurality of open sections OP are formed in the protection layer PAC. A portion of the sacrificial layer SL is exposed through the open section OP in the protection layer PAC. The open section OP is formed by removing a portion of the protection layer PAC. For example, the portion of the protection layer PAC may be removed by a dry-etching process or a wet-etching process. The protection layer PAC has a tapered shape with respect to the temporary substrate SUB. Namely, with respect to the temporary substrate SUB, an upper portion of the open section OP has a width (area) greater than a lower portion of the opening section OP.

Figure 5B:
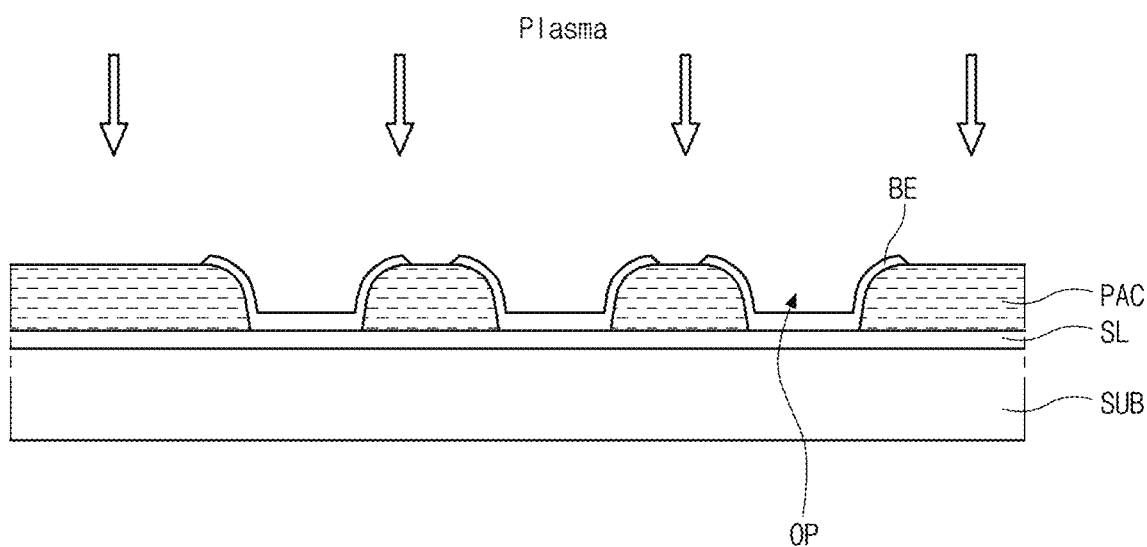

As shown in FIG. 5B, the first pad electrode BE is disposed on the protection layer PAC. For example, the first pad electrode BE may include a single metal layer, such as a molybdenum (Mo) layer or an indium-tin-oxide (ITO) layer, or a multiple metal layers, such as Mo/Al or Mo/Al/Mo. The first pad electrode BE may be disposed to cover the open section OP in the protection layer PAC. As will be described later, the single pad electrode may include a plurality of first pad electrodes BE respectively covering the plurality of open sections OP. The first pad electrodes BE in adjacent open sections OP are spaced apart from each other. The first pad electrode BE in the open section OP contacts the portion of the sacrificial layer SL exposed through the open section OP. In addition, the first pad electrode BE may cover a side surface of the protection layer PAC in the open section OP. Adjacent two first pad electrodes BE are spaced apart from each other in a top surface of the protection layer PAC between adjacent two open sections OP.

Thereafter, a plasma treatment process is performed on the protection layer PAC to improve an adhesion strength at the interface. In this instance, the first pad electrode BE arranged in the open section OP is also plasma-treated. The plasma treatment process is performed using an ionized gas such as argon (Ar), oxygen ($O_2$), hydrogen ($H_2$) and nitrogen ($N_2$). The adhesion strength between the barrier layer BR and each of the protection layer PAC and the first pad electrode BE and/or between the second pad electrode TE and the first pad electrode BE are improved by the plasma treatment to the protection layer PAC and/or the first pad electrode BE such that the problem of defects in a flexible environment is minimized or prevented. Namely, since a surface of the protection layer PAC and a surface of the first pad electrode BE are plasma-treated, an adhesion strength between the protection layer PAC and the barrier layer BR and an adhesion strength between the first pad electrode BE and the second pad electrode TE are improved. In other words, in a case that the touch substrate TSP and the display substrate DSP are attached, an interface between a lower surface of the first pad electrode BE, which is disposed at an uppermost position, an upper surface of the second pad electrode TE, which is adjacent to the first pad electrode BE, is plasma-treated.

When the sacrificial layer SL on the temporary substrate SUB is exposed to the plasma treatment process, there may be a problem in the laser lift-off process of the sacrificial layer SL. However, in the present disclosure, since the plasma treatment is performed after the first pad electrode BE, which covers the open section OP, the sacrificial layer SL on the temporary substrate SUB is not exposed to the plasma treatment process such that the problem in the laser lift-off process is prevented.

In the above-described configuration, the arrangement order of the first pad electrode BE and the protection layer PAC may be changed. In this case, after the first pad electrode BE is disposed on the sacrificial layer SL, the protection layer PAC is disposed. The open section OP may be formed in the protection layer PAC by forming a contact hole corresponding to the first pad electrode BE. By performing the plasma treatment process onto the protection layer PAC and the first pad electrode BE after the protection layer PAC is formed, the same effect can be obtained.

The arrangement order between the first pad electrode BE and the protection layer PAC may be selectively changed. The first pad electrode BE may be disposed on the inner surface of the open section OP according to the arrangement order. When the first pad electrode BE is disposed before the protection layer PAC is disposed, there is an advantage of obtaining a more stable electrical connection characteristic in connection with a circuit board using a conductive ball. On the other hand, when the protection layer PAC is disposed before the first pad electrode BE is disposed, the electrical connection of the first pad electrode with another electrode, which is disposed by extending from the touch sensor over the first pad electrode BE, can be further improved.

Figure 5C:
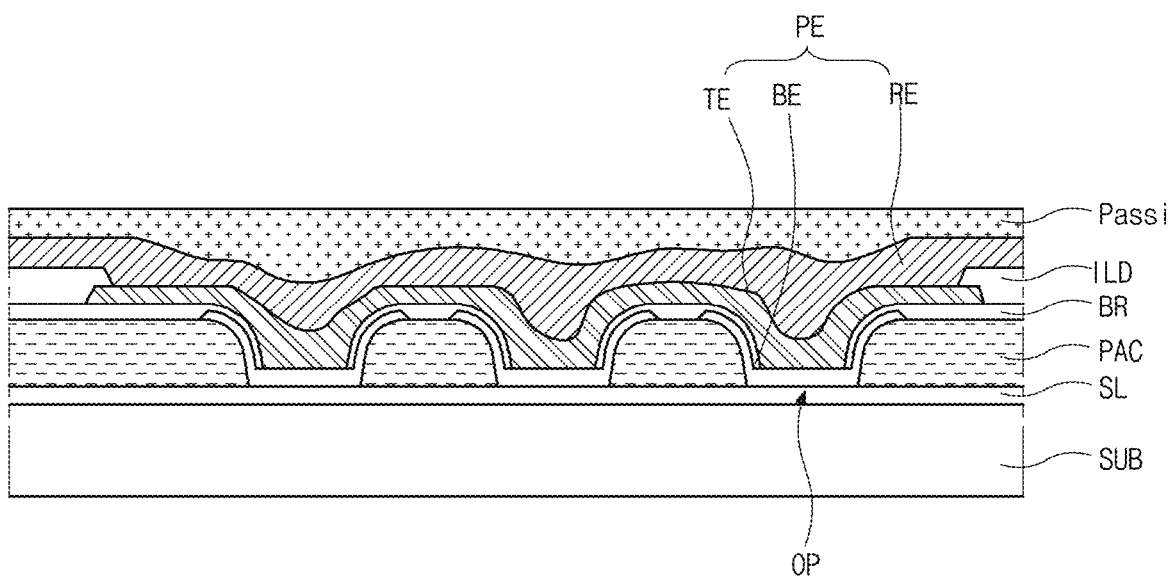

As shown in FIG. 5C, the barrier layer BR is disposed on the protection layer PAC to improve the uniformity of the touch signal. In the outer portion (peripheral portion) of the touch substrate TSP, where the barrier layer BR and the sacrificial layer SL directly contact, the releasing (separation) problem of the barrier layer BR from the sacrificial layer SL may occur. In the present disclosure, the plasma treatment process is performed onto the protection layer PAC.

For example, the barrier layer BR may be formed to correspond to an upper surface and a side surface of the protection layer PAC. As a result, in the open section OP, both ends of the first pad electrode BE are covered with the barrier layer BR, and a center of the first pad electrode BE is exposed. The barrier layer BR may be omitted.

Next, the first touch electrode TX, the second pad electrode TE, the first insulating layer ILD, the second touch electrode RX and the third pad electrode RE are sequentially formed. The first touch electrode TX and the second touch electrode RX are insulated by the first insulating layer ILD in the active area AA, while the second pad electrode TE and the third pad electrode RE contact each other in the touch pad region to form the pad electrode PE.

In more detail, after the barrier layer BR is formed, the first touch electrode TX and the second pad electrode TE are formed. The first touch electrode TX and the second pad electrode TE are formed of the same material and spaced apart from each other. The second pad electrode TE in the open section OP contacts the first pad electrode BE.

Next, the first insulating layer ILD covering the first touch electrode TX and exposing the second pad electrode TE is formed. Edges of the second pad electrode TE may be covered with the first insulating layer ILD.

Next, the second touch electrode RX, which corresponding to the first touch electrode TX, is formed on the first insulating layer ILD, and the third pad electrode RE extending from the second touch electrode RX is formed on the second pad electrode TE. The pad electrode PE in the opening section OP may have a triple-layered structure including the first to third pad electrodes BE, TE and RE, and the pad electrode PE on the protection layer PAC between adjacent open sections OP may have a double-layered structure including the second and third pad electrodes TE and RE.

Each of the first touch electrode TX, the second pad electrode TE, the second touch electrode RX and the third pad electrode RE may include a single-layered structure of a metallic material, e.g., Al, AlNd, Mo, MoTi, Cu, or Cr, or a transparent conductive material, e.g., indium-tin-oxide (ITO), indium-zinc-oxide (IZO) or gallium-doped zinc oxide (GZO). Alternatively, each of the first touch electrode TX and the second touch electrode RX may include a double-layered structure of a metal layer and a transparent conductive material layer. When the first and second touch electrodes TX and RX have the single-layered structure, the first and second touch electrodes TX and Rx may be arranged to form a mesh shape.

Next, the second insulating layer Passi is disposed on the pad electrode PE to protect the pad electrode PE and to provide a planar (or flat) top surface.

Figure 5D:
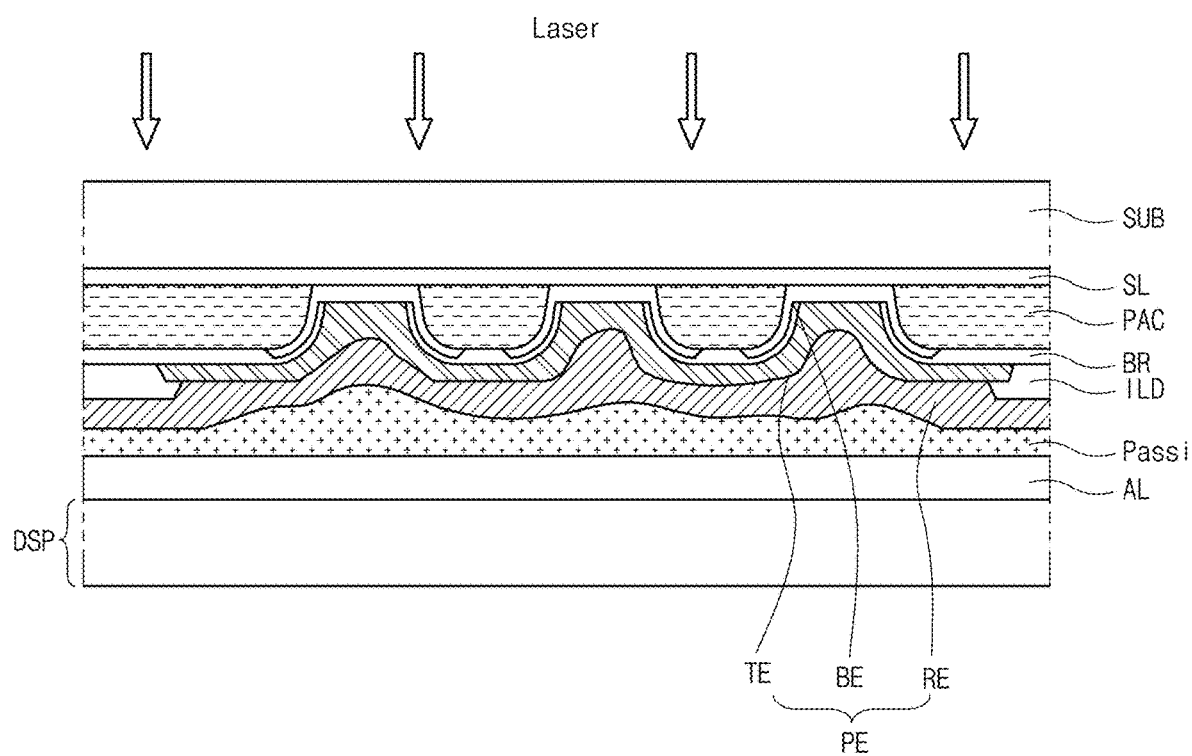
Figure 5E:
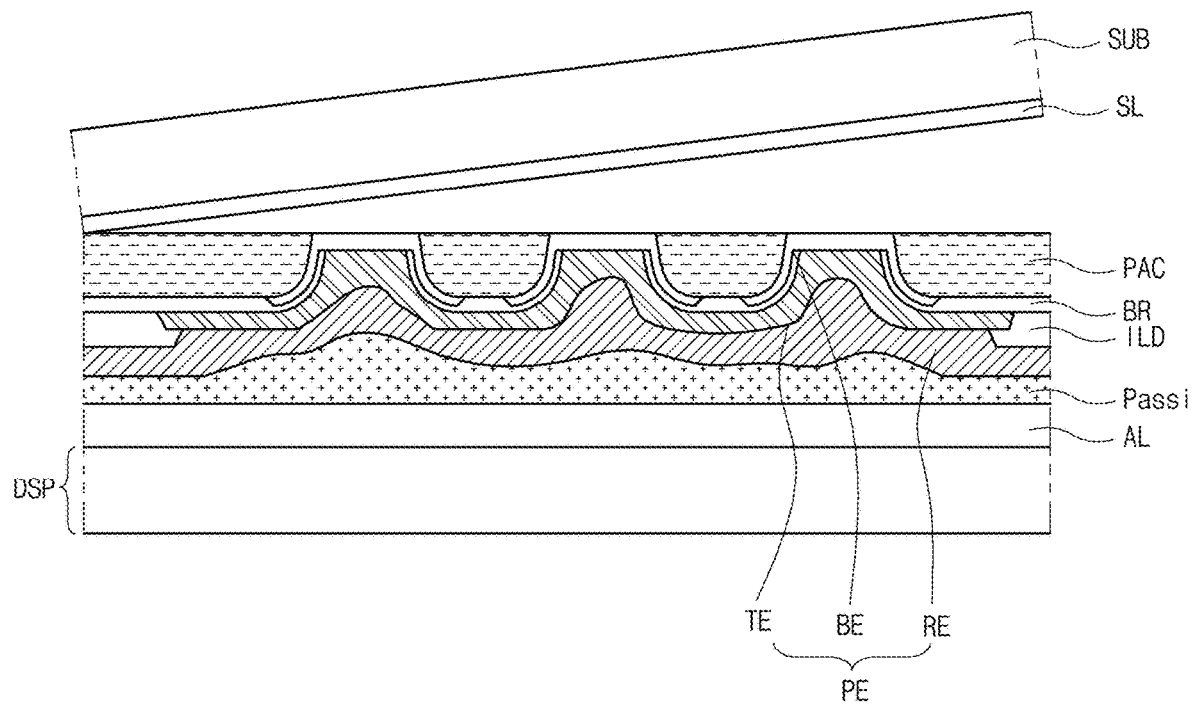

As shown in FIGS. 5D and 5E, the temporary substrate SUB is removed (separated).

Particularly, as shown in FIG. 5D, the touch substrate TSP and the display substrate DSP are attached by an adhesive layer AL. The adhesive layer AL may be an epoxy adhesive. Namely, the touch substrate TSP and the display substrate DSP are attached such that the second insulating layer Passi of the touch substrate TSP faces the display substrate DSP.

After the touch substrate TSP and the display substrate DSP are attached, a laser is irradiated onto a rear surface of the temporary substrate SUB. The hydrogen in amorphous silicon of the sacrificial layer SL is dehydrogenated by the laser such that a surface of the sacrificial layer SL bursts. As a result, the sacrificial layer SL with the temporary substrate SUB are separated from the protection layer PAC.

Next, a wet-etching process using an acid solution or the like may be optionally performed to remove a residue of the sacrificial layer SL on the protection layer PAC and the first pad electrode BE.

The laser in the process of separating the temporary substrate SUB may be a diode pumped solid state (DPSS) laser or an excimer laser.

It will be apparent to those skilled in the art that various modifications and variations can be made in the aspects of the disclosure without departing from the spirit or scope of the disclosure. Thus, it is intended that the present disclosure covers the modifications and variations of this disclosure provided they come within the scope of the appended claims and their equivalents.

What is claimed is:

1. A touch display device, comprising:
   a plurality of emitting elements;
   an adhesive layer over the emitting elements;
   a first touch electrode and a second touch electrode over the adhesive layer and in an active area;
   a pad electrode over the adhesive layer and in a touch pad region; and a protection layer over the first touch electrode, the second touch electrode and the pad electrode, wherein the first touch electrode and the second touch electrode are insulated by an insulating layer, and the protection layer includes at least one contact hole corresponding to the pad electrode, wherein the pad electrode includes a plurality of electrode layers, and one of the plurality of electrode layers extends from the first touch electrode or the second touch electrode, wherein the plurality of electrode layers include a first pad electrode in the at least one contact hole, a second pad electrode contacting the first pad electrode, and a third pad electrode contacting the second pad electrode, and wherein the second pad electrode and the third pad electrode are respectively disposed on the same layer as the first touch electrode and the second touch electrode.

2. The touch display device according to claim 1, wherein a surface of at least one of the plurality of electrode layers is plasma-treated.

3. The touch display device according to claim 1, wherein an interface between the first pad electrode and the second pad electrode is plasma-treated.

4. The touch display device according to claim 1, wherein the contact hole has a pentagonal shape or a hexagonal shape, and the pad electrode corresponds to two or more contact holes.

5. The touch display device according to claim 1, further comprising an encapsulation layer between the emitting element and the adhesion layer, wherein the emitting element is an organic light emitting diode, and the encapsulation layer covers the organic light emitting diode.

6. The touch display device according to claim 1, wherein the protection layer is formed of photo-acryl, and an inner surface of the at least one contact hole has a reverse-tapered shape.

7. The touch display device according to claim 1, wherein an edge of the first pad electrode covers a side surface of the protection layer in the contact hole.

8. The touch display device according to claim 1, wherein the protection layer is disposed between the first pad electrode and the second pad electrode.

9. The touch display device according to claim 1, wherein the first pad electrode, the second pad electrode, and the third pad electrode overlap with one another in a plan view.

10. A method of manufacturing a touch display device, comprising:

forming a sacrificial layer on a temporary substrate;
forming a protection layer including a contact hole in a touch pad region on the sacrificial layer;
forming a first pad electrode in the touch pad region;
forming a first touch electrode on the protection layer and a second pad electrode on the first pad electrode;
forming an insulating layer covering the first touch electrode and exposing the second pad electrode; and
forming a second touch electrode on the insulating layer and a third pad electrode on the second pad electrode;
attaching the temporary substrate and a display substrate; and
removing the temporary substrate and the sacrificial layer.

11. The method according to claim 10, further comprising:

performing a plasma treatment to a portion of the protection layer.

12. The method according to claim 11, wherein the plasma treatment uses one of an Ar gas plasma, an $O_2$ gas plasma, a $H_2$ gas plasma and a $N_2$ gas plasma, and a portion of the first pad electrode is plasma-treated in the step of performing the plasma treatment.

13. The method according to claim 10, wherein the step of removing the temporary substrate and the sacrificial layer includes irradiating a laser to reduce an adhesion strength of the sacrificial layer.

14. The method according to claim 10, wherein a portion of the sacrificial layer is exposed through the contact hole.

15. The method according to claim 14, wherein the first pad electrode contacts the portion of the sacrificial layer in the contact hole.

16. The method according to claim 10, wherein the step of forming the first pad electrode is prior to the step of forming the protection layer.

17. The method according to claim 10, wherein the protection layer covers edges of the first pad electrode.

18. The method according to claim 10, wherein the contact hole has a pentagonal shape or a hexagonal shape.

19. The method according to claim 10, wherein one of the second pad electrode and the third pad electrode is electrically connected to one of the first touch electrode and the second touch electrode.

20. The method according to claim 19, wherein the one of the second and third pad electrodes extends from the one of the first and second touch electrodes.

* * * * *